United States Patent [19]
Pang

[11] Patent Number: 5,945,859
[45] Date of Patent: Aug. 31, 1999

[54] TRIGGER VOLTAGE CONTROLLABLE SCHMITT TRIGGER CIRCUIT

[75] Inventor: Dai Sung Pang, Seoul, Rep. of Korea

[73] Assignee: LG Semicon Co., Ltd., Chungcheongbuk-do, Rep. of Korea

[21] Appl. No.: 08/951,515

[22] Filed: Oct. 16, 1997

[30] Foreign Application Priority Data

Apr. 24, 1997 [KR] Rep. of Korea ............ 97-15434

[51] Int. Cl.⁶ .................. H03K 3/037; H03K 5/153
[52] U.S. Cl. .................................. 327/206; 327/74
[58] Field of Search ........................ 327/205, 206, 327/68, 74, 76

[56] References Cited

U.S. PATENT DOCUMENTS

| | | | |
|---|---|---|---|
| 4,464,587 | 8/1984 | Suzuki et al. | 327/206 |
| 4,719,367 | 1/1988 | Denda | 327/206 |
| 4,883,975 | 11/1989 | Enomoto et al. | 327/206 |
| 5,327,020 | 7/1994 | Ikeda | 327/206 |
| 5,336,942 | 8/1994 | Khayat | 327/206 |
| 5,438,292 | 8/1995 | Tadokoro | 327/206 |
| 5,602,496 | 2/1997 | Mahmood | 327/206 |

FOREIGN PATENT DOCUMENTS

| | | | |
|---|---|---|---|
| 363087814 | 4/1988 | Japan | 327/206 |
| 405129898 | 5/1993 | Japan | 327/206 |
| 405299981 | 11/1993 | Japan | 327/206 |

*Primary Examiner*—Toan Tran

[57] ABSTRACT

A trigger voltage controllable Schmitt trigger circuit consists of: a trigger-inverting output unit for trigger-inverting input signals in a predetermined margin; a trigger voltage control signal output unit for generating control signals for controlling trigger voltage according to external control signals, the unit including a linear differential amplifier; and first and second trigger voltage control units for changing margins of trigger performed by the trigger-inverting output unit, the units including transistors whose resistance ratios linearly change according to the control signals from the trigger voltage control signal output unit.

14 Claims, 5 Drawing Sheets

TRIGGER VOLTAGE CONTROLLABLE SCHMITT TRIGGER CIRCUIT

BACKGROUND OF THE INVENTION

1. Field of the Invention

The present invention relates to a Schmitt trigger circuit. Specifically, this invention is a trigger voltage controllable Schmitt trigger circuit where levels of trigger voltage can be varied according to external control signals.

2. Discussion of Related Art

Once an output voltage is reversed, it does not change even if an input voltage varies near a threshold voltage in a Schmitt trigger circuit, thus the circuit is maintained at a stable state. This stability is proportional to the volume of hysteresis.

This Schmitt trigger circuit having such a property is utilized as an input buffer for pulse waveshaping, elimination of chattering, and prevention of noise impact.

A conventional Schmitt trigger circuit is described below with reference to the attached drawings.

FIG. 1 is a diagram of the conventional Schmitt trigger circuit. FIG. 2 is a graph showing the trigger points of the conventional Schmitt trigger circuit.

Trigger voltage is constant in the conventional Schmitt trigger circuit. The circuit consists of: first and second pMOS transistors M1 and M2, and first and second nMOS transistors M4 and M3, which are connected one another in series, and whose gates are commonly connected to an input terminal; third pMOS transistor M5 where its drain is connected to the source of first pMOS transistor M1 and its source is grounded; and third nMOS transistor M6 where its source is connected to the source of second nMOS transistor M3 and its drain is connected to a power source voltage terminal. Second nMOS transistor M3 is connected to third nMOS transistor M2 in series. First pMOS transistor M1 is connected to a power source voltage terminal, and first nMOS transistor M4 is grounded. The gates of third pMOS transistor M5 and third nMOS transistor M6 are commonly connected to second nMOS transistor M3, the drain of second pMOS transistor M2, and the output terminal.

This conventional Schmitt trigger circuit, as a modified buffer or inverter, is designed so that its DC transfer curve has a predetermined noise margin, instead of following the logic threshold voltage of general buffer or inverter when input increases from LOW to HIGH or decreases from HIGH to LOW.

With reference to FIG. 2, the operation of this conventional Schmitt trigger circuit is described below.

When input transforms from LOW to HIGH, output is HIGH. When the input exceeds the threshold voltage of first nMOS transistor M4, first nMOS transistor M4 is on, following the start of third nMOS transistor M6. Once third nMOS transistor M6 is on, voltage is applied to the source of second nMOS transistor M3. To turn on second nMOS transistor M3, voltage (B shown in FIG. 2) obtained by adding its threshold voltage to the voltage which is applied to its source, must be supplied to its gate. This is because first nMOS transistor M4 and third nMOS transistor M6 are composed in a specified resistance ratio. If the input voltage continuously increases, the output decreases to LOW and is grounded.

When the input decreases from HIGH to LOW, so the potential level of the input terminal becomes lower than the threshold voltage of first pMOS transistor M1, first pMOS transistor M1 is on. Third pMOS transistor M5 is then on, and first pMOS transistor M1 and third pMOS transistor M5 have a resistance ratio.

Third pMOS transistor M5 is on, and voltage is supplied to the source of second pMOS transistor M2. To turn on second pMOS transistor M2, voltage (A shown in FIG. 2) obtained by subtracting its threshold voltage from the voltage applied to its source, must be applied. If the level of the input voltage continuously decreases, first pMOS transistor M1 and second pMOS transistor M2 pass the power source, thus the output is settled to the potential of the power source voltage.

The conventional Schmitt trigger circuit changes output values in a predetermined noise margin according to the control of the trigger voltage by first and third pMOS transistors M1 and M5 and first and third nMOS transistors M4 and M6.

As shown in FIG. 2, since this conventional Schmitt trigger voltage has a fixed trigger voltage, it must be replaced with another IC having a different trigger voltage level when the trigger voltage is necessary to be changed. This produces the problem of applicability.

SUMMARY OF THE INVENTION

Accordingly, the present invention is directed to a trigger voltage controllable Schmitt trigger circuit that substantially obviates one or more of the limitations and disadvantages of the related art.

An object of the present invention is to provide a trigger voltage controllable Schmitt trigger circuit for changing the level of trigger voltage according to external control signals.

Additional features and advantages of the invention will be set forth in the description which follows, and in part will be apparent from the description, or may be learned by practice of the invention. The objectives and other advantages of the invention will be realized and attained by the structure as illustrated in the written description and claims hereof, as well as the appended drawings.

To achieve these and other advantages, and in accordance with the purpose of the present invention as embodied and broadly described, a trigger voltage controllable Schmitt trigger circuit consists of: a trigger-inverting output unit for trigger-inverting input signals in a predetermined margin; a trigger voltage control signal output unit for generating control signals for controlling trigger voltage according to external control signals, the unit including a linear differential amplifier; and first and second trigger voltage control units for changing margins of trigger performed by the trigger-inverting output unit, the units including transistors whose resistance ratios linearly change according to the control signals from the trigger voltage control signal output unit.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF PREFERRED EMBODIMENT

Reference will now be made in detail to the preferred embodiments of the present invention, examples of which are illustrated in the accompanying drawings.

Figure 1:
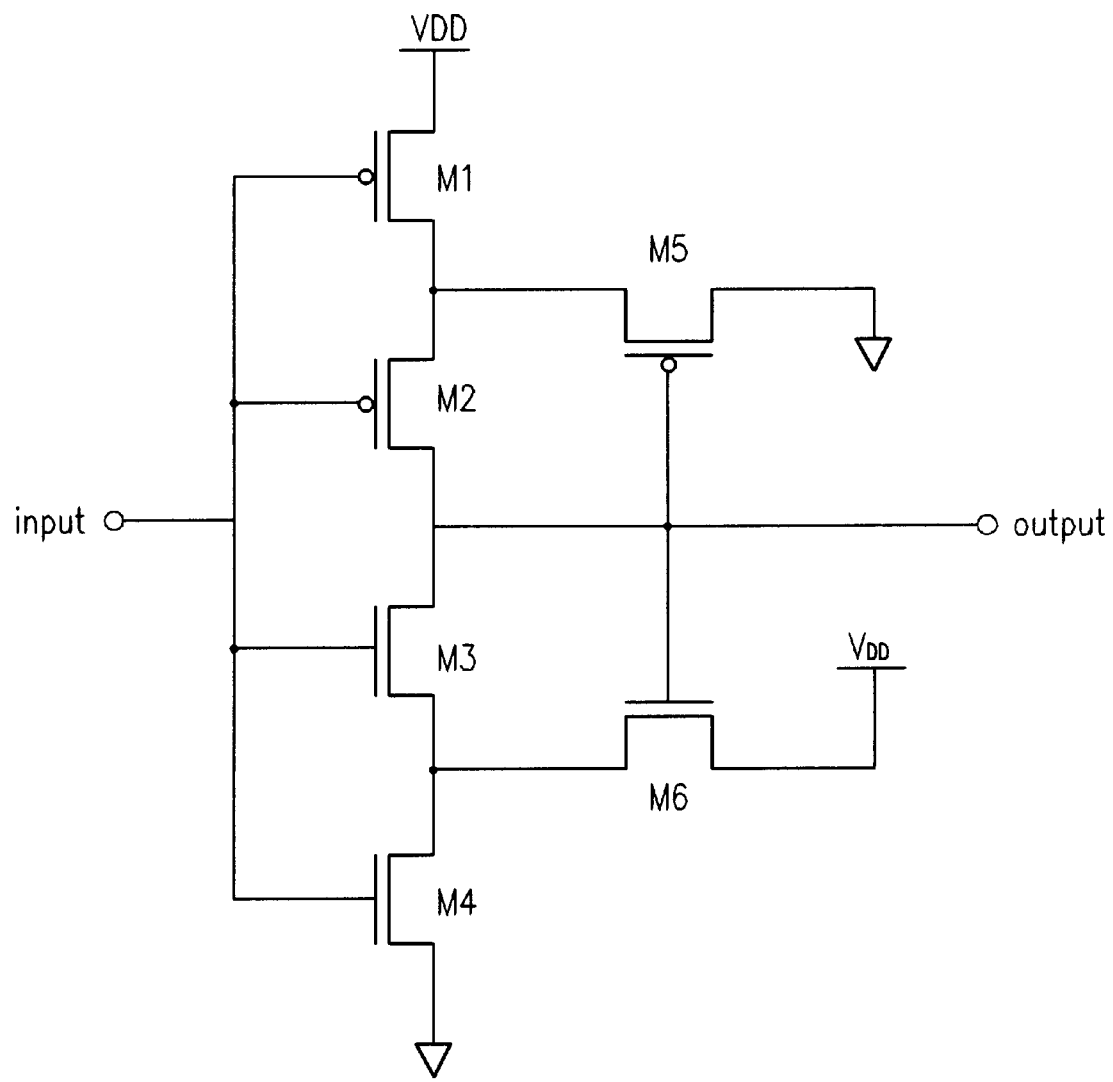
FIG. 1 is a diagram of a conventional Schmitt trigger circuit.
Figure 2:
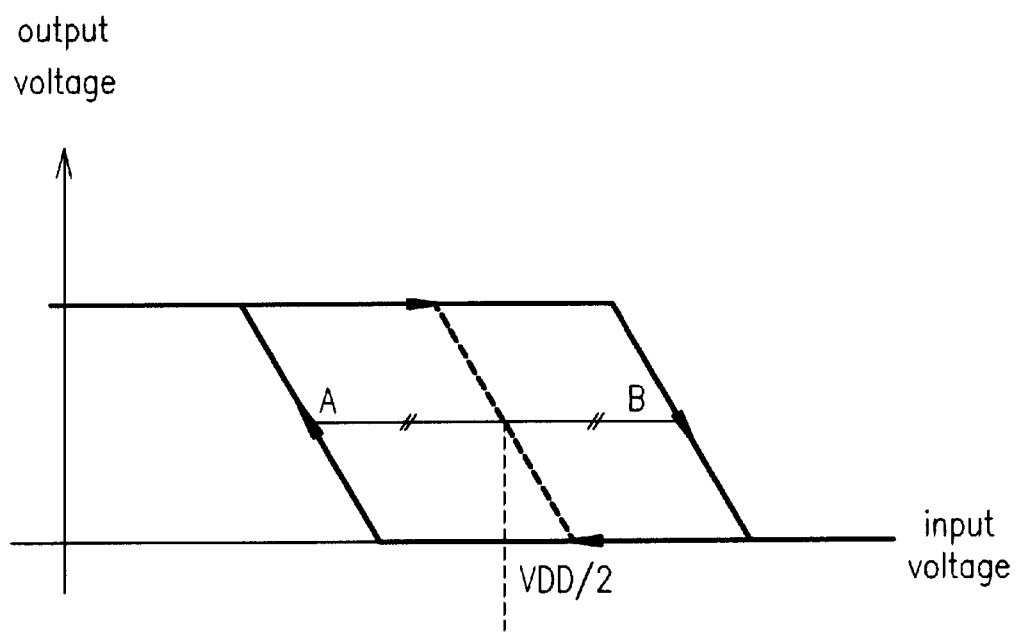
FIG. 2 is a graph showing the trigger points of the conventional Schmitt trigger circuit.
Figure 3:
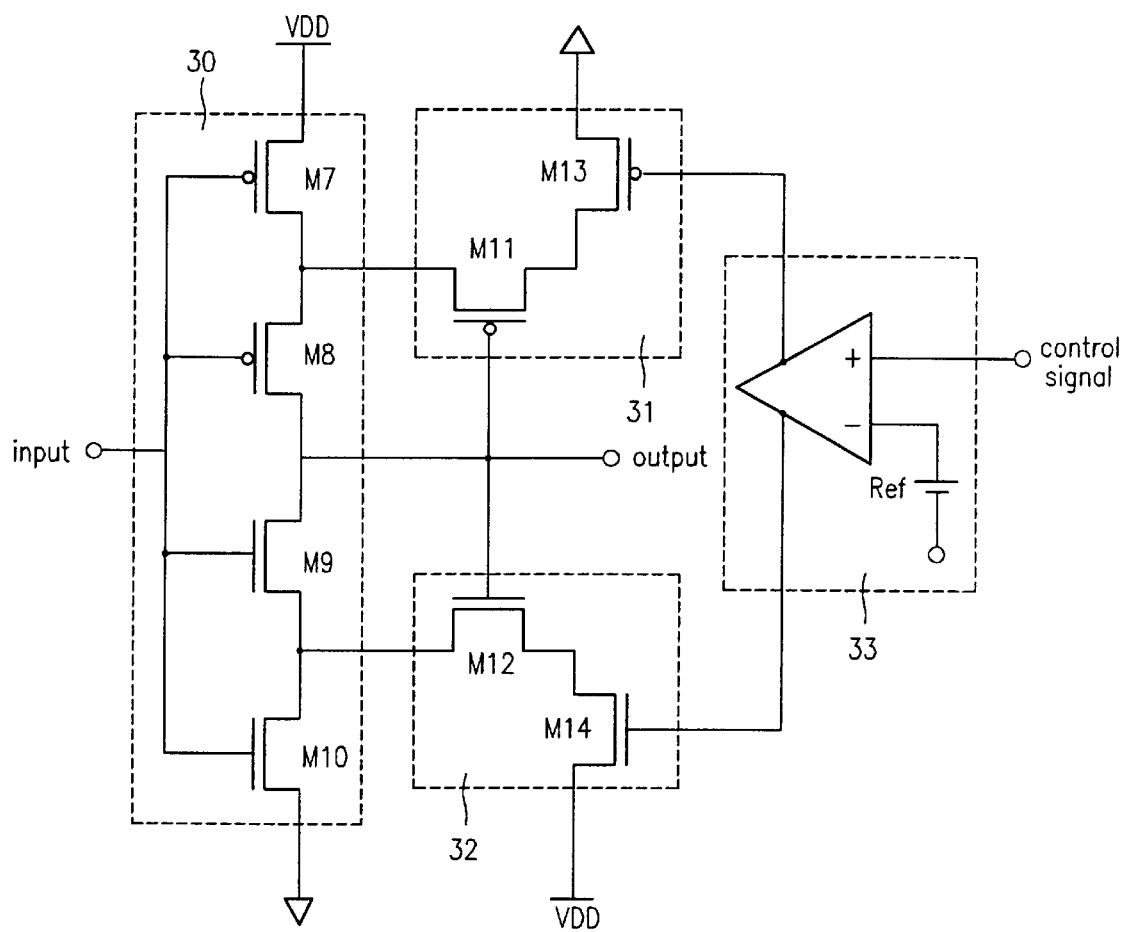
FIG. 3 is a diagram of a Schmitt trigger circuit according to the present invention.
Figure 4B:
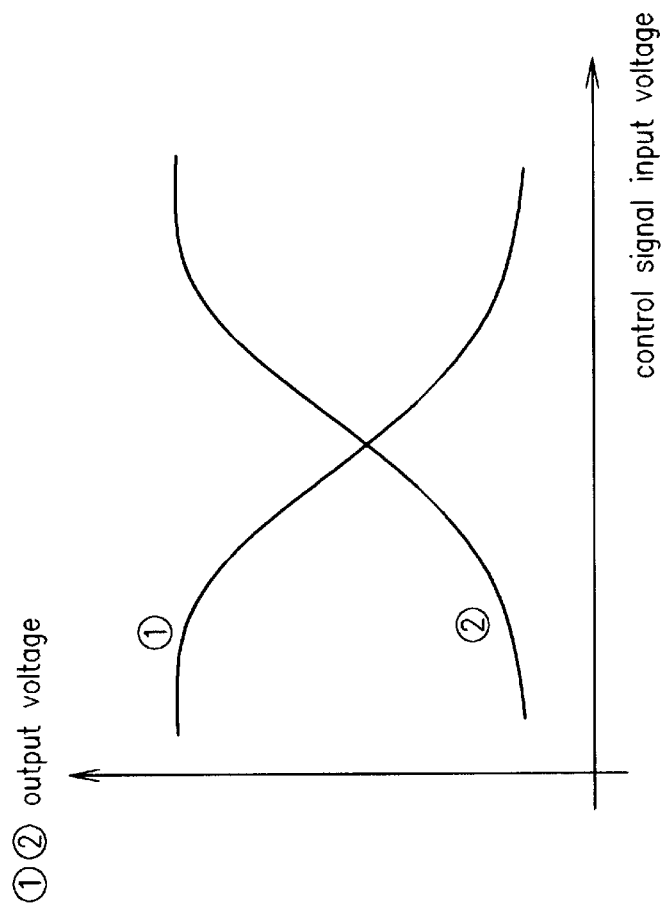
FIG. 4A shows a circuit diagram of linear differential amplifier and FIG. 4B shows its waveform diagram.
Figure 4A:
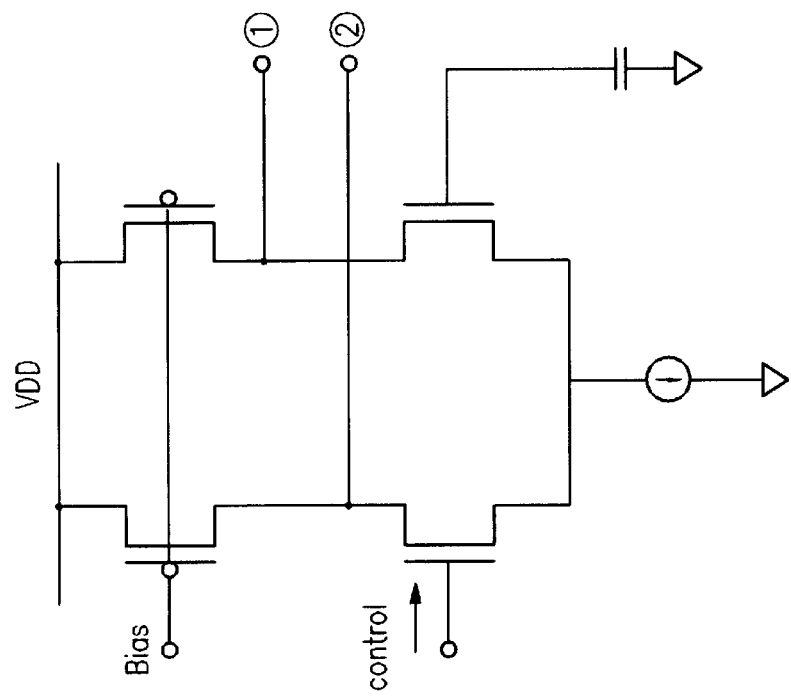
Figure 5:
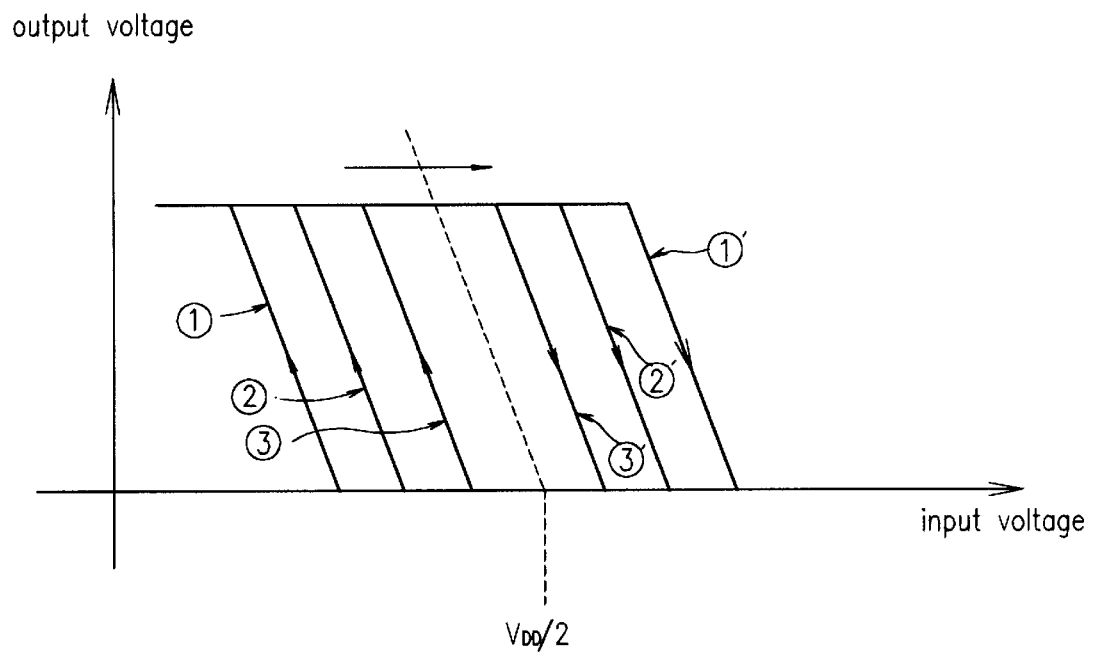
FIG. 5 is a graph showing the trigger points of a Schmitt trigger circuit according to the present invention.

With reference to FIGS. 3 to 5, the trigger voltage controllable Schmitt trigger circuit of the present invention is described below in detail.

The Schmitt trigger circuit according to the present invention consists of: trigger-inverting output unit 30, for trigger-inverting input signals in a predetermined margin; trigger voltage control signal output unit 33, for receiving external control signals for controlling trigger voltage, and generating control signals for controlling negative or positive trigger voltage; first and second trigger voltage control units 31 and 32, for controlling the level of the trigger voltage according to the control signals from trigger voltage control signal output unit 33, and transmitting it to trigger-inverting output unit 3.

This Schmitt trigger circuit of the present invention controls the level of the trigger voltage depending upon the voltage supplied from the outside. The following is the detailed description of components in each block.

Trigger-inverting output unit 30 consists of first and second pMOS transistors M7 and M8, and second and first nMOS transistors M9 and M10 which are connected one another in series, and where their gates are commonly connected to the input terminal. Second nMOS transistor M9 is connected to second pMOS transistor M8 in series. The source of first pMOS transistor M7 is connected to a power source voltage terminal, and the source of first nMOS transistor M10 is grounded.

First trigger voltage control unit 31 consists of: fourth pMOS transistor M11 where its source is connected to the drain of first pMOS transistor M7 in trigger-inverting output unit 30; and fifth pMOS transistor M13 where its source is connected to the drain of fourth pMOS transistor M11 and its drain is grounded.

Second trigger voltage control unit 32 consists of: fourth nMOS transistor M12 where its source is connected to the drain of first nMOS transistor M10 in trigger-inverting output unit 30; and fifth nMOS transistor M14 where its source is connected to the drain of fourth nMOS transistor M12 and its drain is grounded.

The gates of fourth pMOS transistor M11 and fourth nMOS transistor M12 are commonly connected to the drain of second pMOS transistor M8 in trigger-inverting output unit 30 and to the output terminal. The gates of fifth pMOS transistor M13 and fifth nMOS transistor M14 are respectively connected to the output terminals of a linear differential amplifier included by trigger voltage control signal output unit 33.

Trigger voltage control signal output unit 33 includes the linear differential amplifier, for generating trigger voltage control signals for controlling the level of the trigger voltage, according to the external control signals. There are two terminals in the linear differential amplifier; one receives the control signals from the outside, and the other receives reference voltage. FIG. 4A shows the configuration of the linear differential amplifier, and FIG. 4B shows the output voltages changing according to the control signals.

The following is the description of the trigger operation in this trigger voltage controllable Schmitt trigger circuit according to the present invention.

Output is HIGH, and the potential level of the input terminal continuously increases during the transition of the input from LOW to HIGH. When the potential level exceeds the threshold voltage of first nMOS transistor M10, first nMOS transistor M10 is turned on. From this time, the serial path consisting of first, fourth and fifth nMOS transistors M10, M12 and M14, operates in a resistance ratio. Trigger operations a, b, and c shown in FIG. 5 are carried out according to the resistance ratios between the above transistors. "a, b, and c" shown in FIG. 5 are examples illustrating the change of trigger voltages, but the trigger voltages linearly change between a and c. Illustrated above, the level of the trigger voltages change because fifth nMOS transistor M14 varies the resistance ratio between first, fourth, and fifth nMOS transistors M10, M12, and M14. The fifth nMOS transistor M14 operates as a variable resistor, in response to the trigger voltage control signal generated form the differential amplifier in trigger voltage control signal output unit 33.

As shown in the waveform diagram of FIG. 4B, the linear differential amplifier in trigger voltage control signal output unit 33 can change the output from LOW to HIGH linearly. When driving fifth nMOS transistor M14 with the voltage changing linearly, the resistance of fifth nMOS transistor M14 as a resistor can be linearly changed from OFF to ON.

The output is LOW when the input transforms from HIGH to LOW. When the input is lower than the threshold voltage of first pMOS transistor M7, first pMOS transistor M7 is turned on. From this time, the serial path consisting of first, fourth and fifth pMOS transistors M7, M11 and M13, operates in a resistance ratio. Trigger operations ①, ②, and ③ shown in FIG. 5 are carried out according to the resistance ratios between the above transistors. ①, ②, and ③ shown in FIG. 5 are examples illustrating the change of trigger voltages, but the trigger voltages linearly change between ① and ③. Illustrated above, the level of the trigger voltages change because fifth pMOS transistor M13 varies the resistance ratio between first, fourth, and fifth pMOS transistors M7, M11, and M13. The fifth pMOS transistor M13 operates as a variable resistor, in response to the trigger voltage control signal generated form the differential amplifier in trigger voltage control signal output unit 33.

As shown in the waveform diagram of FIG. 4B, the linear differential amplifier in trigger voltage control signal output unit 33 can change the output from LOW to HIGH linearly. When driving fifth pMOS transistor M13 with the voltage changing linearly, the resistance of fifth pMOS transistor M13 as a resistor can be linearly changed from OFF to ON. The linear change signifies that fifth pMOS transistor M13 and fifth nMOS transistor M14 have sequential resistances from OFF to ON. The two transistors M13 and M14 are designed to operate in the same direction, thus when the resistance of fifth PMOS transistor M13 increases, the resistance of fifth nMOS transistor M14 increases. The increased amounts of the two resistances preferably match together, but giving more trigger voltage control margin to the particular direction such as LOW or HIGH, is possible by changing the resistance ratio between fifth pMOS transistor M13 and fifth nMOS transistor M14.

If adding a feedback loop which changes trigger voltage according to noise detection signals, instead of using external control signals, systems can have an optimal noise margin.

As illustrated, in a trigger voltage controllable Schmitt trigger circuit of the present invention, which is capable of changing trigger voltage according to external control signals, a user can control the level of the trigger voltage when necessary. Therefore, the applicability of the circuit is improved.

It will be apparent to those skilled in the art that various modifications and variations can be made in a trigger voltage controllable Schmitt trigger circuit of the present invention without deviating from the spirit or scope of the invention. Thus, it is intended that the present invention cover the modifications and variations of this invention provided they come within the scope of the appended claims and their equivalents.

What is claimed is:

1. A trigger-voltage-controllable Schmitt trigger circuit comprising:

a trigger-inverting output unit for trigger-inverting input signals in a predetermined margin, said trigger inverting output unit including
        first and second PMOS transistors and first and second NMOS transistors connected in series, gates thereof being commonly connected to an input terminal;
    a trigger voltage control unit for generating control signals to dynamically control first and second margin setting units according to external control signals, the unit including a linear differential amplifier; and
    said first and second margin setting units for changing a margin of the trigger-inverting output unit, the units including transistors whose resistance ratios linearly change according to the control signals from the trigger voltage control unit.

2. The circuit according to claim 1, wherein a non-inverting terminal of the linear differential amplifier in the trigger voltage control unit receives the external control signals, and an inverting terminal of the linear differential amplifier receives a reference voltage.

3. The circuit according to claim 1, wherein the second nMOS transistor is connected to the second pMOS transistor in series, the first pMOS transistor's source is connected to a power source voltage terminal, and the first nMOS transistor's source is grounded.

4. The circuit according to claim 3, wherein the first margin setting unit unit comprises: a fourth pMOS transistor where its source is connected to the first pMOS transistor's drain in the trigger-inverting output unit; and a fifth pMOS transistor where its source is connected to the fourth pMOS transistor's drain and its drain is grounded, the second margin setting unit comprising: a fourth nMOS transistor where its source is connected to the first nMOS transistor's drain in the trigger-inverting output unit; and a fifth nMOS transistor where its source is connected to the fourth nMOS transistor's drain and its drain is connected to the power source voltage terminal.

5. The circuit according to claim 4, wherein respective gates of the fourth pMOS transistor and fourth nMOS transistor in the first and second trigger voltage control units are commonly connected to the drain of the second pMOS transistor in the trigger-inverting output unit and to an output terminal.

6. The circuit according to claim 4, wherein gates of the fifth pMOS and nMOS transistors in the first and second voltage control units are respectively connected to output terminals of the linear differential amplifier.

7. The circuit according to claim 4, wherein said predetermined margin can be given more in either a positive or negative direction by changing a resistance ratio between the fifth pMOS and nMOS transistors in the first and second trigger voltage control units.

8. A Schmitt trigger having a dynamically adjustable amount of hysterisis, said Schmitt trigger comprising:

four transistors connected in series between a first system voltage and a second system voltage, a first one and second one of said transistors being of a first conductivity type, a third one and a fourth one of said transistors being of a second conductivity type opposite to said first conductivity type, gates of said four transistors each being connected to a signal input of said Schmitt trigger, said first transistor being connected to said first system voltage and said fourth transistor being connected to said second system voltage, and an output of said Schmitt trigger being a node between said second and third transistors;
    a dynamically adjustable reference voltage circuit, including a differential amplifier, for adjusting said amount of hysterisis of said Schmitt trigger;
    a fifth transistor connected between said dynamically adjustable reference voltage circuit and a node betwixt said first and second transistors, the gate of said fifth transistor being connected to said output of said Schmitt trigger, and said fifth transistor being of said first conductivity type; and
    a sixth transistor connected between said dynamically adjustable reference voltage circuit and a node betwixt said third and fourth transistors, the gate of said sixth transistor being connected to said output of said Schmitt trigger, and said sixth transistor being of said second conductivity type.

9. The Schmitt trigger of claim 8, wherein said dynamically adjustable reference voltage circuit is responsive to an external control signal.

10. The Schmitt trigger of claim 9, wherein said dynamically adjustable reference voltage circuit includes a first variable resistor between said fifth transistor and said second system voltage and a second variable resistor between said sixth transistor and said first system voltage, said first and second variable resistors being responsive to said external control signal.

11. The Schmitt trigger of claim 10, wherein said first variable resistor is a seventh transistor and said second variable resistor is an eighth transistor, said seventh transistor being of said first conductivity type and said eighth transistor being of said second conductivity type.

12. The Schmitt trigger of claim 11, wherein said differential amplifier is interposed between said external control signal and gates of said seventh and eighth transistors, respectively.

13. The Schmitt trigger of claim 8, wherein said first conductivity type is P-type and said second conductivity type is N-type.

14. The Schmitt trigger of claim 8, wherein said first system voltage is VDD and said second system voltage is ground.

\* \* \* \* \*